US011836366B2

(12) United States Patent
Bae

(10) Patent No.: US 11,836,366 B2
(45) Date of Patent: Dec. 5, 2023

(54) MEMORY SYSTEM AND METHOD OF OPERATING THE SAME

(71) Applicant: SK hynix Inc., Gyeonggi-do (KR)

(72) Inventor: Ju Ung Bae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 144 days.

(21) Appl. No.: 17/490,589

(22) Filed: Sep. 30, 2021

(65) Prior Publication Data

US 2022/0317877 A1 Oct. 6, 2022

(30) Foreign Application Priority Data

Apr. 5, 2021 (KR) .......................... 10-2021-0044291

(51) Int. Cl.
| | |
|---|---|
| *G06F 3/06* | (2006.01) |
| *G11C 16/04* | (2006.01) |
| *G11C 16/10* | (2006.01) |
| *G11C 16/34* | (2006.01) |
| *G11C 16/26* | (2006.01) |
| *G11C 29/02* | (2006.01) |
| *G11C 7/04* | (2006.01) |
| *G11C 11/56* | (2006.01) |

(52) U.S. Cl.
CPC ............ *G06F 3/064* (2013.01); *G06F 3/0604* (2013.01); *G06F 3/0679* (2013.01); *G11C 7/04* (2013.01); *G11C 16/0483* (2013.01); *G11C 16/10* (2013.01); *G11C 16/26* (2013.01); *G11C 16/349* (2013.01); *G11C 16/3418* (2013.01); *G11C 16/3431* (2013.01); *G11C 16/3495* (2013.01); *G11C 29/021* (2013.01); *G11C 29/028* (2013.01); *G11C 11/5621* (2013.01)

(58) Field of Classification Search
CPC ..................................................... G11C 4/04
See application file for complete search history.

(56) References Cited

U.S. PATENT DOCUMENTS

| | | | | |
|---|---|---|---|---|
| 2013/0346805 A1* | 12/2013 | Sprouse | ............. | G11C 16/3431 714/E11.178 |
| 2014/0068365 A1* | 3/2014 | Chen | ..................... | G06F 11/106 714/E11.023 |
| 2017/0140802 A1* | 5/2017 | Jeon | ......................... | G11C 7/14 |

(Continued)

FOREIGN PATENT DOCUMENTS

| | | |
|---|---|---|
| KR | 1020170086173 A | 7/2017 |
| KR | 1020190123090 A | 10/2019 |

*Primary Examiner* — Douglas King
(74) *Attorney, Agent, or Firm* — IP & T GROUP LLP

(57) ABSTRACT

A memory controller may control a memory device including a plurality of memory blocks each including a plurality of pages. The memory controller may include a scan voltage controller configured to control the memory device to apply a plurality of scan voltages to any one page of the plurality of pages, a counter configured to obtain, based on sensed data obtained by reading the any one page using the plurality of scan voltages, the number of memory cells having a threshold voltage included in at least one voltage range defined by the plurality of scan voltages from among a plurality of memory cells included in the any one page, and a data manager configured to control the memory device to store data stored in a memory block including the any one page in another memory block, based on the number of memory cells.

20 Claims, 12 Drawing Sheets

(56) References Cited

U.S. PATENT DOCUMENTS

| | | | | |
|---|---|---|---|---|
| 2018/0329649 A1* | 11/2018 | Chien | ............... | G06F 3/0679 |
| 2018/0350446 A1* | 12/2018 | K | ........................ | G11C 29/76 |
| 2019/0362796 A1* | 11/2019 | Choi | ................... | G11C 16/14 |
| 2020/0066355 A1* | 2/2020 | Papandreou | ........ | G06F 11/0793 |
| 2022/0139481 A1* | 5/2022 | Rayaprolu | .......... | G06F 11/3037 |
| | | | | 365/185.09 |

* cited by examiner

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2021-0044291 filed on Apr. 5, 2021, in the Korean Intellectual Property Office, the entire disclosure of which is incorporated by reference herein.

BACKGROUND

Field of Invention

Various embodiments of the present disclosure generally relate to an electronic device, and more particularly, a memory system including a memory device and a memory controller, and a method of operating the memory system.

Description of Related Art

A memory system is a device which stores data under control of a host device such as a computer or a smartphone. The memory system may include a memory device configured to store data, and a memory controller configured to control the memory device. Memory devices may be classified into volatile memory devices and nonvolatile memory devices.

A volatile memory device may be a memory device, which stores data only when power is supplied thereto, and in which data stored therein is lost when power is turned off. Examples of a volatile memory device may include a static random access memory (SRAM), and a dynamic random access memory (DRAM).

A nonvolatile memory device is a memory device in which data stored therein is maintained even when power is turned off. Examples of a nonvolatile memory device may include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a memory system capable of rapidly and accurately determining a deterioration state of a memory block to maintain reliability of data, and a method of operating the memory system.

An embodiment of the present disclosure may provide a memory controller configured to control a memory device including a plurality of memory blocks each including a plurality of pages. The memory controller may include: a scan voltage controller configured to control the memory device to apply a plurality of scan voltages to any one page of the plurality of pages; a counter configured to obtain, based on sensed data obtained by reading the any one page using the plurality of scan voltages, a number of memory cells having a threshold voltage included in at least one voltage range defined by the plurality of scan voltages from among a plurality of memory cells included in the any one page; and a data manager configured to control the memory device to store data stored in a memory block including the any one page in another memory block, based on the number of memory cells.

An embodiment of the present disclosure may provide a method of operating a memory controller configured to control a memory device including a plurality of memory blocks each including a plurality of pages. The method may include: controlling the memory device to apply a plurality of scan voltages to any one page of the plurality of pages; obtaining, based on sensed data obtained by reading the any one page using the plurality of scan voltages, a number of memory cells having a threshold voltage included in at least one voltage range defined by the plurality of scan voltages from among a plurality of memory cells included in the any one page; and controlling the memory device to store data stored in a memory block including the any one page in another memory block, based on the number of memory cells.

DETAILED DESCRIPTION

Specific structural or functional descriptions in the embodiments of the present disclosure introduced in this specification or application are only for description of the embodiments of the present disclosure. The descriptions and/or scope of the claims should not be construed as being limited to the embodiments described in the specification or application.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

Figure 1:
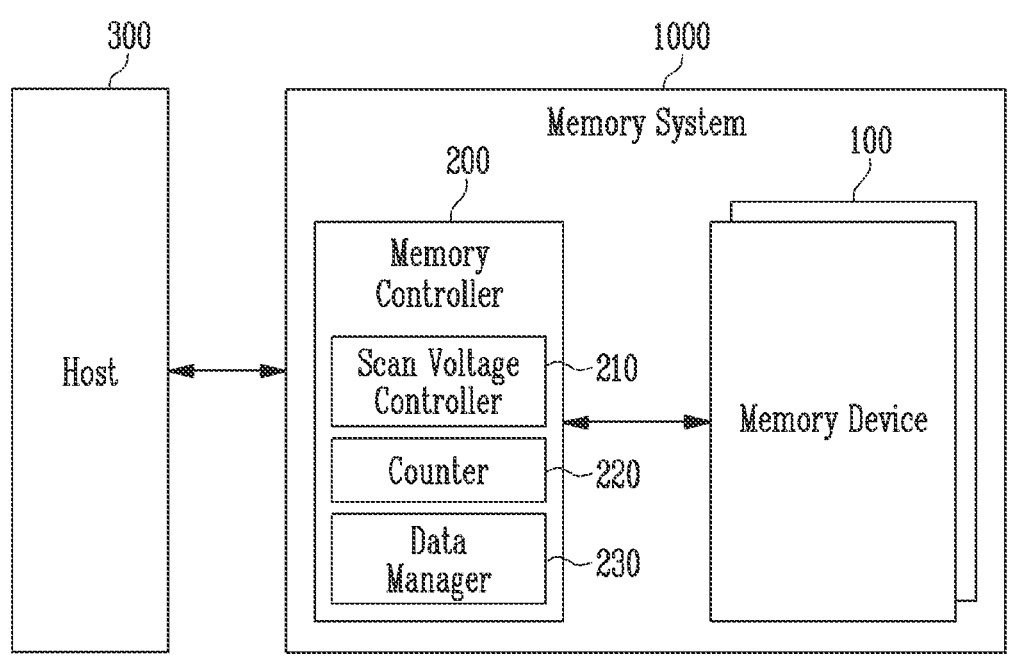
FIG. 1 is a diagram illustrating a memory system in accordance with an embodiment of the present disclosure.

FIG. 1 is a diagram illustrating a memory system 1000 in accordance with an embodiment of the present disclosure.

Referring FIG. 1, the memory system 1000 in accordance with the embodiment of the present disclosure may include at least one memory device 100 and a memory controller 200.

The memory system 1000 may be a storage device based on a semiconductor. The memory system 1000 may store data under control of the host 300. The memory system 1000 may provide the stored data to the host 300 under control of the host 300.

The memory system 1000 may be formed of any one of various kinds of storage devices, depending on a host interface, which is a communication scheme for communicating with the host 300. For example, the memory system 1000 may be formed of any one of various kinds of storage devices such as a solid state disk (SSD), a multi media card (MMC), embedded MMC (eMMC), a reduced-size MMC (RS-MMC), a micro-MMC, a secure digital (SD) card, a mini-SD card, a micro-SD card, a universal serial bus (USB) type storage device, a universal flash storage (UFS), a personal computer memory card international association (PCMCIA) device, a peripheral component interconnection (PCI) device, a PCI express (PCI E), device, a compact flash (CF) card, a smart media card, a memory stick, etc.

The memory system 1000 may be manufactured in the form of any one of various package types. For instance, the memory system 1000 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. In detail, the memory device 100 may include a plurality of memory blocks. Each of the plurality of memory blocks ray include a plurality of pages. In other words, each memory block may include a plurality of pages. Here, each page may be the unit on which a program (e.g., write) operation of storing data is performed. Furthermore, each page may be the unit on which a read operation of reading the stored data is performed. Still further, each memory block may be the unit on which an erase operation of erasing the stored data is performed. Each of the plurality of pages may include a plurality of memory cells. Data independent from each other may be respectively stored in the plurality of memory cells. Data may be a value of at least one bit unit. Data may represent various kinds of information such as a character, a numeral, a sign, an image, audio, etc.

The memory device 100 may be operated under control of the memory controller 200. If a command is received from the memory controller 200, the memory device 100 may perform an operation corresponding to the command. Here, the command may be any one of a program command, a read command, and an erase command.

In an embodiment, the memory device 100 may be implemented as a NAND flash memory, a vertical NAND flash memory, a NOR flash memory, a static random access memory (SRAM), a dynamic RAM (DRAM), a synchronous dynamic RAM (SDRAM), a double data rate (DDR) SDRAM, a low power DDR (LPDDR) SDRAM, a graphics DRAM (GDRAM), a Rambus DRAM (RDRAM), a Ferro electric RAM (FeRAM), a magnetoresistive RAM (MRAM), a phase change random access memory (PCRAM), a spin transfer torque magnetoresistive RAM (SST-MRAM), a resistive RAM (ReRAM), etc. In this specification, for the sake of explanation, it is assumed that the memory device 100 is a NAND flash memory.

The memory controller 200 may control the overall operation of the memory system 1000.

When power is applied to the memory system 1000, the memory controller 200 may execute instructions, e.g., firmware (FW). The firmware may include a host interface layer (HIL) configured to control communication with the host 300, a flash translation layer (FTL) configured to control communication between the host 300 and the memory device 100, and a flash interface layer (FIL) configured to control communication with the memory device 100. The memory controller 200 may be disposed outside the memory device 100. The memory controller 200 may be coupled with the memory device 100 through a channel.

The memory controller 200 may control the memory device 100. In an embodiment, the memory controller 200 may control the memory device 100 in response to a request received from the host 300. In an embodiment, the memory controller 200 may independently control the memory device 100 regardless a request from the host 300.

The memory controller 200 may control the memory device 100 to perform one of a program operation, a read operation, and an erase operation.

In the case of the program operation, the memory controller 200 may provide a program command, an address, and data to the memory device 100. In response to this, the memory device 100 may store the data in a page selected by the address.

In the case of the read operation, the memory controller 200 may provide a read command and an address to the memory device 100. In response to this, the memory device 100 may provide the data stored in the page selected by the address to the memory controller 200 or the host 300.

In the case of the erase operation, the memory controller 200 may provide an erase command and an address to the memory device 100. In response to this, the memory device 100 may erase the data stored in a memory block selected by the address.

The host 300 may control the memory system 1000. For example, the host 300 may provide, to the memory system 1000, data and a command for instructing to store the data. In response to this, the memory system 1000 may store the data in the memory device 100. For instance, the host 300 may provide a command for requesting the stored data, to the memory system 1000. In response to this, the memory system 1000 may provide the data stored in the memory device 100 to the host 300. In another instance, the host 300 may provide a command for erasing the stored data to the memory system 1000. In response to this, the memory system 1000 may erase the data stored in the memory device 100.

The host 300 may communicate with the memory system 1000 using at least one of various communication standards or interfaces such as a universal serial bus (USB), a serial AT attachment (SATA), a serial attached SCSI (SAS), a high speed intership (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The host 300 may be one of various electronic devices such as a cellular phone, a smartphone, an MP3 player, a laptop computer, a desktop computer, a game machine, a television (TV), a tablet PC, an in-vehicle infotainment system, and a wearable device. The memory system 1000 may be implemented as a separate device independent from the host 300, or may be implemented in the form of being embedded in the host 300.

Data stored in a memory block of the memory device 100 may deteriorate due to various causes such as time retention, read disturb, and a temperature increase. In other words, a threshold voltage of a memory cell that represents the data may undesirably vary, so that the reliability of the stored data may be reduced. With technology development, the number of memory cells included in each memory block has increased. Hence, there are difficulties in inspecting the degree with which data of all memory cells included in each memory block has deteriorated, e.g., in terms of restriction of resources, a reduction in speed, an increase in power consumption, etc.

The memory controller 200 in accordance with an embodiment of the present disclosure may control the memory device 100 to store (e.g., move) data stored in a memory block, in another memory block before deterioration progresses to a point where the data cannot be normally read from the existing memory block.

Accordingly, the memory controller 200 may control the memory device 100 to apply a plurality of scan voltages to any one page of a plurality of pages. Here, each of the plurality of scan voltages may be a voltage for defining at least one voltage range. For example, a plurality of scan voltages may include first and second scan voltages. Here, the first scan voltage may be a maximum value in a first voltage range, and the second scan voltage may be a minimum value in the second voltage range. The any one page that is a target to which the scan voltages are applied may be a random page or a predetermined page from among a plurality of pages included in the memory block.

The memory controller 200 may obtain, based on sensed data obtained by reading any one page with a plurality of scan voltages, the number of memory cells that have threshold voltages included in at least one voltage range defined by the plurality of scan voltages, from among a plurality of memory cells included in the any one page. Here, the sensed data may be data that indicates the number of memory cells having threshold voltages lower than a scan voltage. At least one voltage range may be one range or two or more ranges. For example, at least one voltage range may include a first voltage range and a second voltage range.

The memory controller 200 may control the memory device 100 to store (e.g., move) data stored in a memory block in which any one page is included, in another memory block based on the number of memory cells. For example, in the case where the number of memory cells is greater than a preset reference value, the memory controller 200 may control the memory device 100 to store data stored in the memory block in which any one page is included, in another memory block.

In accordance with the present disclosure, there may be provided the memory system 1000 capable of rapidly and accurately determining a deterioration state of a memory block to maintain the reliability of data, and a method of operating the memory system 1000. As described above, any one page included in one memory block may be scanned as a representative of other pages included in the corresponding memory block. The reason for this is because of the fact that after a program operation is performed on each of a plurality of memory cells included in one memory block, the threshold voltages of the plurality of memory cells vary in a similar direction and at similar speed. Hence, an operation of scanning some pages rather than all pages makes it possible to estimate a deterioration state of a corresponding memory block, so that the efficiency and accuracy of the scan may be enhanced. Hereinafter, more detailed description will be made with reference to the attached drawings.

Figure 2:
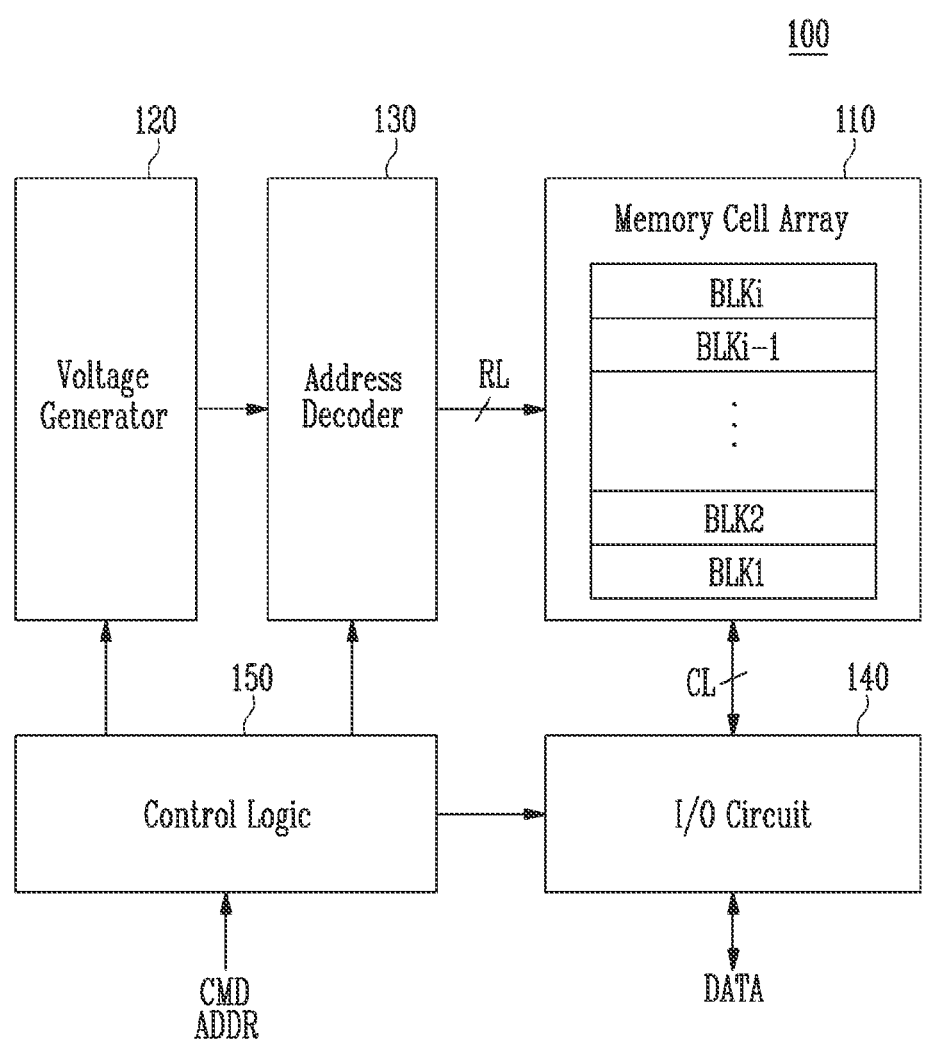
FIG. 2 is a diagram illustrating the structure of a memory device in accordance with an embodiment of the present disclosure.

FIG. 2 is a diagram illustrating the structure of the memory device 100 in accordance with an embodiment of the present disclosure.

Referring to FIG. 2, the memory device 100 includes a memory cell array 110, a voltage generator 120, an address decoder 130, an input/output circuit 140, and a control logic 150.

The memory cell array 110 may include a plurality of memory blocks BLK1 to BLKi. The plurality of memory blocks BLK1 to BLKi may be coupled to the address decoder 130 through row lines RL. The plurality of memory blocks BLK1 to BLKi may be coupled to the input/output circuit 140 through column lines CL. In an embodiment, the row lines RL may include word lines, source select lines, and drain select lines. In an embodiment, the column lines CL may include bit lines.

Each of the memory blocks BLK1 to BLKi may include a plurality of memory cells.

Data may be stored in each of the plurality of memory cells. For example, the plurality of memory cells may store different numbers of bits of data depending on types such as a single level cell (SLC) capable of storing a single bit, a multiple level cell (MLC) capable of storing two bits, a triple level cell (TLC) capable of storing three bits, or a quad level cell (QLC) capable of storing four bits. Here, memory cells coupled to an identical word line among the plurality of memory cells may be referred to as one page.

In an embodiment, each of the plurality of memory cells may be a nonvolatile memory cell. For example, each of the plurality of memory cells may include a floating gate capable of accumulating charges. Each of the plurality of memory cells may represent a specific value of data depending on the amount of charges accumulated in the floating gate.

In an embodiment, the voltage generator 120, the address decoder 130, and the input/output circuit 140 may be collectively called a peripheral circuit. The peripheral circuit may drive the memory cell array 110 under control of the control logic 150. The peripheral circuit may drive the memory cell array 110 to perform a program operation, a read operation, or an erase operation.

The voltage generator 120 may generate a plurality of operating voltages using an external supply voltage supplied to the memory device 100. The voltage generator 120 may be operated under control of the control logic 150.

In an embodiment, the voltage generator 120 may generate an internal supply voltage by regulating the external supply voltage. The internal supply voltage generated from the voltage generator 120 may be used as an operating voltage of the memory device 100.

In an embodiment, the voltage generator 120 may generate a plurality of operating voltages using an external supply voltage or an internal supply voltage. The voltage generator 120 may generate various voltages for the memory device 100. For example, the voltage generator 120 may generate a plurality of erase voltages, a plurality of program voltages, a plurality of pass voltages, a plurality of select read voltages, and a plurality of unselect read voltages. To this end, the voltage generator 120 may include a plurality of pumping capacitors configured to receive an internal supply voltage. The voltage generator 120 may selectively enable the plurality of pumping capacitors under control of the control logic 150 to generate a plurality of operating voltages.

The operating voltages generated in the voltage generator 120 may be supplied to the memory cell array 110 by the address decoder 130.

The address decoder 130 may be coupled to the memory cell array 110 through the row lines RL. The address decoder 130 may be configured to operate under control of the control logic 150. The address decoder 130 may receive an address ADDR from the control logic 150. The address decoder 130 may decode a block address among the received addresses ADDR. The address decoder 130 may select at least one of the memory blocks BLK1 to BLKi according to the decoded block address. The address decoder 130 may decode a row address among the received addresses ADDR. The address decoder 130 may select at least one of the word lines of the selected memory block according to the decoded row address. In an embodiment, the address decoder 130 may decode a column address of the received addresses ADDR. The address decoder 130 may couple the input/output circuit 140 and the memory cell array 110 according to the decoded column address.

For example, the address decoder 130 may include components such as a row decoder, a column decoder, and an address buffer.

The input/output circuit 140 may include a plurality of page buffers. The plurality of page buffers may be coupled to the memory cell array 110 through the bit lines. During a program operation, data stored in the plurality of page buffers may be provided to a selected page through the bit lines, and the provided data may be stored in memory cells included in the selected page. During a read operation, data stored in memory cells in a selected page may be sensed through the bit lines, and the sensed data may be stored in the page buffers.

The control logic 150 may control the address decoder 130, the voltage generator 120, and the input/output circuit 140. The control logic 150 may operate in response to a command CMD transmitted from an external device. The control logic 150 may generate control signals in response to the command CMD and the address ADDR, and control the peripheral circuits.

Figure 3:
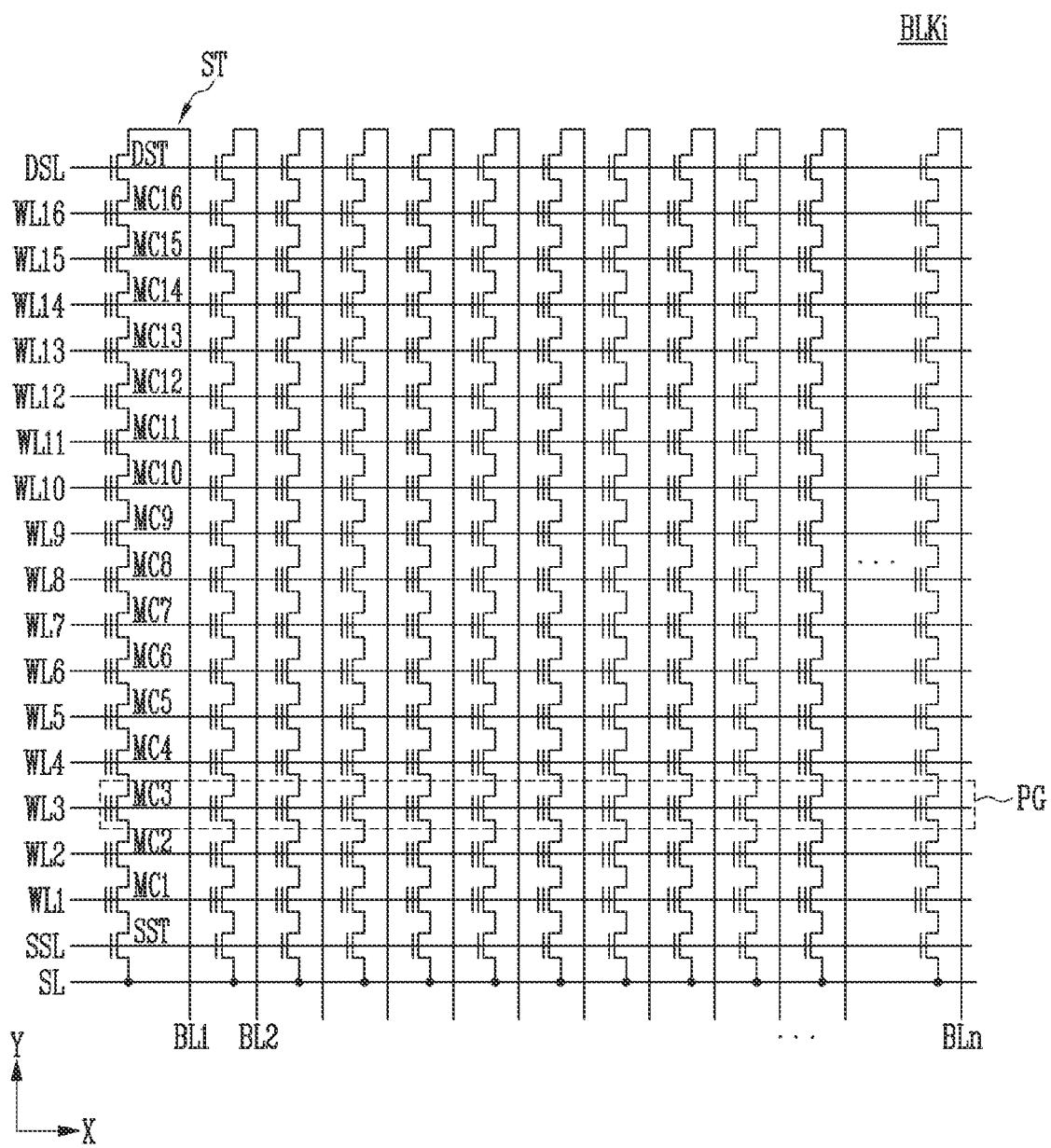
FIG. 3 is a diagram illustrating the structure of a memory block in accordance with an embodiment of the present disclosure.

FIG. 3 is a diagram illustrating the structure of a memory block in accordance with an embodiment of the present disclosure.

Referring to FIG. 3, the memory block BLKi may include a plurality of strings coupled between the bit lines BL1 to BLn and the source line SL. Description of the memory block BLKi may be applied to each of the plurality of memory blocks BLK1 to BLKi.

The plurality of strings may be respectively coupled to the bit lines BL1 to BLn. The plurality of strings may be coupled in common to the source line SL. The plurality of strings may have the same configuration, so that the string ST that is coupled to the first bit line BL1 will be described in detail by way of example. Description of the string ST may be equally applied to the other strings.

The string ST may include a source select transistor SST, a plurality of memory cells MC1 to MC16, and a drain select transistor DST which are coupled in series to each other between the source line SL and the first bit line BL1.

The plurality of memory cells MC1 to MC16 may be coupled in series between the source select transistor SST and the drain select transistor DST. Gates of the plurality of memory cells MC1 to MC16 may be respectively coupled to the plurality of word lines WL1 to WL16. The number of memory cells MC1 to MC16 included in each string ST may be greater or less than the number illustrated in the drawings.

A drain of the drain select transistor DST may be coupled to the first bit line BL1. A gate of the drain select transistor DST may be coupled to the drain select line DSL. A source of the source select transistor SST may be coupled to the source line SL. A gate of the source select transistor SST may be coupled to the source select line SSL. The numbers of source select transistors SST and drain select transistors DST included in each string ST each may be 1 or more.

The plurality of word lines WL1 to WL16, the source select line SSL, and the drain select line DSL may be arranged in parallel to each other. The plurality of word lines WL1 to WL16, the source select line SSL, and the drain select line DSL may be arranged in a direction perpendicular to a direction in which the string ST is arranged.

The memory block BLKi may include a plurality of pages. The page may indicate a group of memory cells coupled to an identical word line. In this case, the memory block BLKi may include pages the number of which are identical with the number of word lines WL1 to WL16. The plurality of pages may have the same configuration, so that the page PG that is coupled to the third word line WL3 will be described in detail by way of example. Description of the page PG may be equally applied to the other pages.

The page PG may include memory cells coupled to the third word line WL3 among a plurality of memory cells included in the memory block BLKi. Each of the memory cells included in the page PG may be memory cells included in respective different strings.

In the case of the program operation, as the memory device 100 applies a program voltage to the page PG, data may be stored in the page PG. In detail, the memory device 100 may apply the program voltage to the third word line WL3. In this case, the program voltage applied to the third word line WL3 may be transmitted to the gate of each of the memory cells included in the page PG coupled to the third word line WL3. If the program voltage is applied to the gate of each of the memory cells included in the page PG, charges may be injected into the floating gate of each of the memory cells included in the page PG through a tunneling phenomenon. The threshold voltage of the memory cell may vary depending on the amount of charges accumulated in the floating gate. Here, the threshold voltage may indicate a voltage to be applied to the gate when a channel is formed so that current can flow between the source and the drain of the memory cell.

Here, the program operation may use an incremental step pulse program (ISPP) scheme. The ISPP scheme may include a plurality of program loops. Each of the plurality of program loops may include a program (PGM) pulse operation of applying a program voltage having a predetermined level to the word line, and a verify operation of determining whether the corresponding program loop has passed or failed, by applying a verify voltage having a predetermined level to the word line.

In the case of the read operation, as the memory device 100 applies a read voltage to the page PG, the data stored in the page PG may be output. In detail, the memory device 100 may apply the read voltage to the third word line WL3. In this case, the read voltage applied to the third word line WL3 may be transmitted to the gate of each of the memory cells included in the page PG coupled to the third word line WL3. In any one memory cell included in the page PG, if the read voltage applied to the gate is greater than the threshold voltage of the corresponding memory cell, current may flow through the bit line coupled with the memory cell. If the read voltage applied to the gate is less than the threshold voltage of the corresponding memory cell, current may not flow through the bit line coupled with the corresponding memory cell. By sensing whether current flows through the bit lines to which the memory cells are respectively coupled, data which may be recognized depending on the level of the read voltage and a sensing result, may be output.

Figure 4:
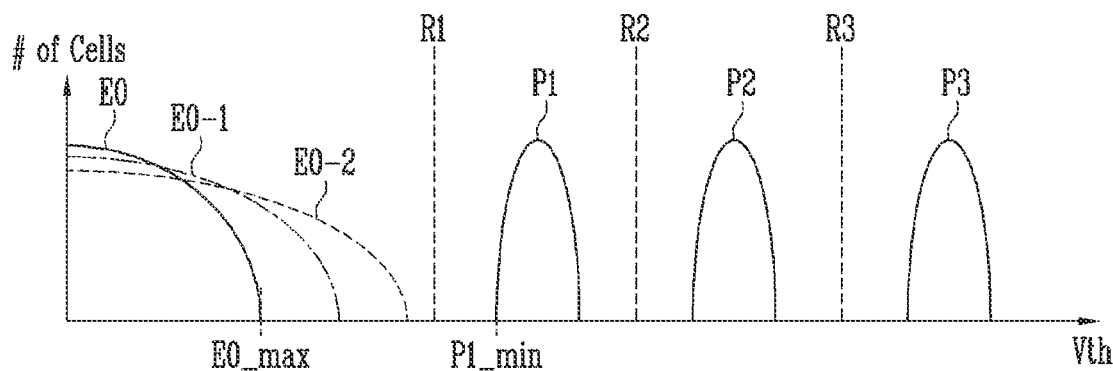
FIG. 4 is a diagram for describing threshold voltages of memory cells in accordance with an embodiment of the present disclosure.

FIG. 4 is a diagram for describing threshold voltages of memory cells in accordance with an embodiment of the present disclosure.

Referring to FIG. 4, the memory device 100 in accordance with an embodiment of the present disclosure may include a plurality of memory cells. Each of the plurality of memory cells may have one programmed state of a plurality of programmed states E0, P1, P2, and P3 which are separated from each other by threshold voltages.

Here, each of the plurality of programmed states E0, P1, P2, and P3 may indicate specific data. For example, the plurality of programmed states E0, P1, P2, and P3 may include an erased state E0, a first programmed state P1, a second programmed state P2, and a third programmed state P3, according to the multiple level cell type. The erased state E0, the first programmed state P1, the second programmed state P2, and the third programmed state P3, each may indicate one of data such as 00, 01, 10, and 11. The erased state E0, the first programmed state P1, the second programmed state P2, and the third programmed state P3, each may be read through at least one read voltage of a plurality of default read voltages R1, R2, and R3.

To this end, the memory device 100 may change the threshold voltage of the memory cell in response to a control command (e.g., an erase command or a program command) of the memory controller 200. Here, the threshold voltage of the memory cell may vary depending on the amount of charges accumulated in the floating gate of the memory cell. For example, the memory device 100 may change the threshold voltage of the memory cell through an erase operation, and change the threshold voltage of the memory cell to one of the first programmed state P1, the second programmed state P2, and the third programmed state P3, through a program operation.

However, this is only an embodiment, and the plurality of programmed states E0, P1, P2, and P3 and the plurality of default read voltages R1, R2, and R3 may include various numbers of programmed states and various numbers of default read voltages, depending on the cell type such as a single level cell, a triple level cell, and a quad level cell. Hereinafter, for the sake of explanation, it is assumed that the plurality of programmed states E0, P1, P2, and P3 according to the present disclosure include programmed states according to the multiple level cell type.

In detail, when a program command is received from the memory controller 200, the memory device 100 may program a plurality of memory cells to any one programmed state of the plurality of programmed states E0, P1, P2, and P3, such that the numbers of memory cells included in the plurality of programmed states E0, P1, P2, and P3 correspond to each other. Here, the words "the numbers of memory cells correspond to each other" may refer to that the numbers of memory cells are substantially identical with each other within an error range.

For example, it is assumed that each page includes 100 memory cells. In the corresponding page, the erased state E0, the first programmed state P1, the second programmed state P2, and the third program state P3, each may include 25 memory cells.

Data stored in a memory block of the memory device 100 may deteriorate due to various causes such as time retention, read disturb, and a temperature increase. In other words, the threshold voltage of the memory cell may be changed. For example, the memory cells of the erased state E0 may be changed in threshold voltage distribution depending on a degree to which the memory cells deteriorate, as shown by a first state E0-1 or a second state E0-2. As the threshold voltage distribution of the memory cells of the erased state E0 is changed, a threshold voltage distribution of memory cells of each of the first programmed state P1, the second programmed state P2, and the third programmed state P3, may be simultaneously changed.

The memory controller 200 in accordance with an embodiment of the present disclosure may control the memory device 100 to store (e.g., move) data, stored in a memory block, in another memory block before deterioration progresses to a point where the data cannot be normally read. Referring again to FIG. 1, this will be described in detail.

The memory controller 200 may include a scan voltage controller 210, a counter 220, and a data manager 230.

The scan voltage controller 210 may control the memory device 100 to apply a plurality of scan voltages to any one page of a plurality of pages. In the following operation, any one page may refer to a page to which a plurality of scan voltages have been applied.

Here, the plurality of scan voltages may have voltage values having different levels. Each of the plurality of scan voltages may correspond to a voltage range. The voltage range will be described in detail with reference to FIG. 5.

The counter 220 may obtain, based on sensed data obtained by reading any one page with a plurality of scan voltages, the number of memory cells that have threshold voltages included in at least one voltage range defined by the plurality of scan voltages, from among a plurality of memory cells included in the any one page. Here, the sensed data may include information indicating the number of memory cells having threshold voltages lower than each scan voltage. A method of obtaining the number of memory cells will be described in detail with reference to FIGS. 7 and 8A to 8C.

The data manager 230 may control the memory device 100 to store data stored in a memory block in which any one page is included, in another memory block based on the number of memory cells.

In an embodiment, when the number of memory cells is a reference value or more, the data manager 230 may control the memory device 100 to store data stored in a memory block in which any one page is included, in another memory block. In other words, the data manager 230 may transmit, to the memory device 100, a command for controlling the memory device 100 to store data stored in a memory block in which any one page is included, in another memory block. Here, the term "another memory block" may refer to another memory block of the same memory device 100 or a memory block of another memory device.

Alternatively, when the number of memory cells is less than the reference value, the data manager 230 may control the memory device 100 to maintain data stored in a memory block in which any one page is included. In other words, the data manager 230 may end a scan operation of detecting deterioration of a memory block. Here, the reference value may be a threshold value of an error correction code (ECC). The threshold value may be the number of memory cells capable of being corrected by the ECC.

In accordance with an embodiment of the present disclosure, at least one voltage range may include two or more scan voltages. Hereinafter, detailed description will be made with reference to FIG. 5.

Figure 5:
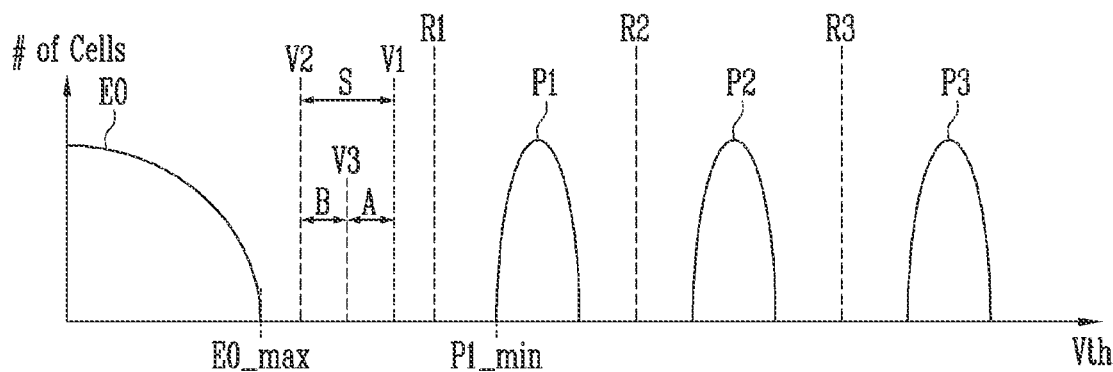
FIG. 5 is a diagram for describing a voltage range in accordance with an embodiment of the present disclosure.

FIG. 5 is a diagram for describing a voltage range in accordance with an embodiment of the present disclosure.

Referring to FIG. 5, at least one voltage range may be defined by a plurality of scan voltages V1, V2, and V3. The plurality of scan voltages V1, V2, and V3 have voltage levels corresponding to inter-program states.

Here, the plurality of scan voltages V1, V2, and V3 may correspond to any one of a maximum value and a minimum value of the at least one voltage range. Each of the plurality of scan voltages V1, V2, and V3 may be a voltage having a level different from that of a default read voltage R1, R2, or R3 for reading data stored in the memory cell.

In an embodiment, at least one voltage range may include one voltage range S defined by the first scan voltage V1 and the second scan voltage V2. In other words, the voltage range S may be defined by the maximum value corresponding to the first scan voltage V1 and the minimum value corresponding to the second scan voltage V2.

In this case, the plurality of scan voltages V1 and V2 may include the first scan voltage V1 and the second scan voltage V2 having a voltage value less than the first scan voltage V1. Here, the voltage range S may include boundary values (e.g., the maximum value and the minimum value) of the voltage range S.

In an embodiment, at least one voltage range may include a first voltage range A and a second voltage range B. Here, the first scan voltage V1 may correspond to a maximum value of the first voltage range A. The third scan voltage V3 may correspond to a minimum value of the first voltage range A and a maximum value of the second voltage range B. The second scan voltage V2 may correspond to a minimum value of the second voltage range B. In other words, the first voltage range A may correspond to a range between the maximum value corresponding to the first scan voltage V1 and the minimum value corresponding to the third scan voltage V3. The second voltage range B may correspond to a range between the maximum value corresponding to the third scan voltage V3 and the minimum value corresponding to the second scan voltage V2. In other words, the first voltage range A and the second voltage range B may be ranges or sections successive to each other, with the third scan voltage V3 as a boundary therebetween.

In this case, the plurality of scan voltages V1, V2, and V3 may include the first scan voltage V1, the second scan voltage V2, and the third scan voltage V3. Here, with regard to the level of the voltage value, the first scan voltage V1 is highest, the third scan voltage V3 is second highest, and the second scan voltage V2 is lowest. Here, the first voltage range A may include boundary values (e.g., the maximum value and the minimum value) of the first voltage range A. Here, the second voltage range B may include boundary values (e.g., the maximum value and the minimum value) of the second voltage range B.

Although not shown in FIG. 5, in an embodiment, the voltage ranges defined by a plurality of scan voltages may be ranges or sections separated from each other. For example, the first voltage range may correspond to a range between a maximum value corresponding to a first scan voltage and a minimum value corresponding to a second scan voltage. The second voltage range may correspond to a range between a maximum value corresponding to a third scan voltage and a minimum value corresponding to a fourth scan voltage. Here, with regard to the level of a voltage value, the first scan voltage is highest, and it may be reduced in a sequence of the second scan voltage, the third scan voltage, and the fourth scan voltage Hereinafter, unless particular description is made, description will be made on the assumption that at least one voltage range according to the present disclosure includes the first voltage range A and the second voltage range B.

Figure 6:
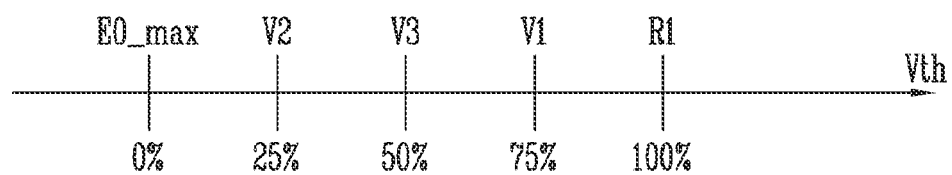
FIG. 6 is a diagram for describing the voltage range of FIG. 5.

FIG. 6 is a diagram for describing the voltage range of FIG. 5.

Referring to FIGS. 5 and 6, at least one voltage range A or B may be included in a range between a maximum value E0_max of initial threshold voltages of erased cells included in any one page and a voltage value of a smallest default read voltage R1 of at least one preset default read voltage R1, R2, and R3 of the memory device 100.

Here, the erased cells may refer to memory cells that enter the erased state E0 when an erase operation is performed on a plurality of memory cells included in a memory block. The initial threshold voltages of the erased cells may refer to threshold voltages of the erased cells when the erase operation is performed. In other words, the initial threshold voltages may refer to threshold voltages of the erased cells that are before the threshold voltages thereof are changed. The maximum value E0_max of the initial threshold voltages of the erased cells may be a preset value or an estimated value. For example, the maximum value E0_max of the initial threshold voltages of the erased cells may be a value which is 300 mv less than a voltage value of the smallest default read voltage R1.

Furthermore, at least one preset default read voltage of the memory device 100 may be set in number and level to different values, depending on a data storage method according to a memory cell type such as a single level cell, a multiple level cell, a triple level cell, and a quad level cell. For example, in the case of an SLC, the at least one default read voltage may include a first default read voltage R1. For example, in the case of an MLC, the at least one default read voltage may include a first default read voltage R1, a second default read voltage R2, and a third default read voltage R3. In this case, the first default read voltage R1 may have a smallest voltage value.

As such, the range between the maximum value E0_max of the initial threshold voltages of the erased cells having the erased state E0 and the voltage value of the smallest default read voltage R1 may include at least one voltage range A, B. In other words, each of the plurality of scan voltages V1, V2, and V3 may have a level between the maximum value E0_max of the initial threshold voltages of the erased cells having the erased state E0, and the voltage value of the smallest default read voltage R1.

In an embodiment, if it is assumed that the maximum value E0_max of the initial threshold voltages of the erased cells having the erased state E0 and the voltage value of the smallest default read voltage R1 are respectively 0% and 100%, the first scan voltage V1 may be relatively set to a voltage value having a 75% level, and the second scan voltage V2 may be relatively set to a voltage value having a 25% level. The third scan voltage V3 may be set to a voltage value having a 50% level corresponding to a median or average of the first scan voltage V1 and the second scan voltage V2. However, this is only an embodiment, and a voltage value of each of the plurality of scan voltages V1, V2, and V3 may be changed in various ways.

In an embodiment, the at least one voltage range A, B may be included in a range between the maximum value E0_max of the initial threshold voltages of the erased cells having the erased state E0 and a minimum value P1_min of the initial threshold voltages of memory cells having the first programmed state P1. In other words, each of the plurality of scan voltages V1, V2, and V3 may have a level between the maximum value E0_max of the initial threshold voltages of the erased cells having the erased state E0 and the minimum value P1_min of the initial threshold voltages of the memory cells having the first programmed state P1.

Figure 7:
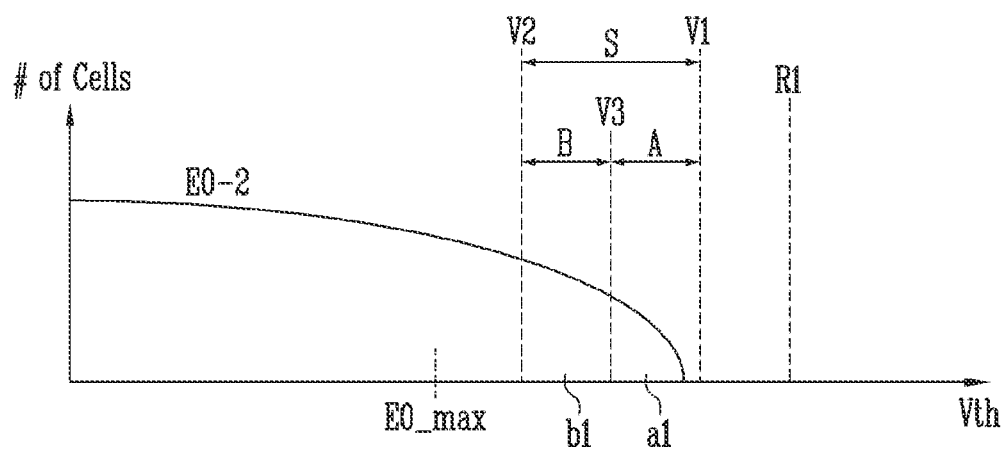
FIG. 7 is a diagram for describing the number of memory cells in the voltage range in accordance with an embodiment of the present disclosure.

FIG. 7 is a diagram for describing the number of memory cells in the voltage range in accordance with an embodiment of the present disclosure.

Referring to FIG. 7, the memory cells having the erased state E0 may be changed in threshold voltage distribution, as shown by a second state E0-2. Here, the at least one voltage range A, B may include a first voltage range A and a second voltage range B. The first voltage range A and the second voltage range B may be ranges for sensing changes in threshold voltages of erased cells. A plurality of scan voltages V1, V2, and V3 may include a first scan voltage V1 corresponding to a maximum value of the first voltage range A, a second scan voltage V2 corresponding to a minimum value of the second voltage range B, and a third scan voltage V3 corresponding to a minimum value of the first voltage range A and a maximum value of the second voltage range B.

In this case, the data manager 230 may control the memory device 100 to store data stored in a memory block in another memory block, based on the number a1 of first memory cells and the number b1 of second memory cells. Here, the number a1 of first memory cells may refer to the number of memory cells the threshold voltages of which are included in the first voltage range A. The number b1 of second memory cells may refer to the number of memory cells the threshold voltages of which are included in the second voltage range B.

Here, if the number a1 of first memory cells is a first reference number or more, the data manager 230 may control the memory device 100 to store the data stored in the memory block in another memory block. Here, the first reference number may be a threshold value of an ECC.

Here, if the number a1 of first memory cells is less than the first reference number and the number b1 of second memory cells is a second reference number or more, the data manager 230 may control the memory device 100 to store data stored in the memory block in another memory block. The second reference number may be a value greater than the first reference number. For example, the second reference number may be set to various values, e.g., a value two or three times the first reference number or the threshold value of the ECC.

Here, if the number a1 of first memory cells is less than the first reference number, and the number b1 of second memory cells is less than the second reference number, the data manager 230 may control the memory device 100 to maintain data stored in a memory block in which any one page is included. In other words, the data manager 230 may end a scan operation of detecting deterioration of a memory block.

In an embodiment, if a ratio of the number a1 of first memory cells and the number b1 of second memory cells is a reference ratio or more, the data manager 230 may control the memory device 100 to store the data stored in the memory block in another memory block. Here, the ratio of the number a1 of first memory cells and the number b1 of second memory cells, may be a value obtained by dividing the number b1 of second memory cells by the number a1 of first memory cells. The reference ratio may be set to various values such as 2 or 3.

In an embodiment, if the ratio of the number of first memory cells and the number of second memory cells is a reference ratio or more, the data manager 230 may control the scan voltage controller 210 to apply a test read voltage to each of a plurality of pages included in the memory block. A test read voltage may be a voltage for reading the number of memory cells each having an abnormal threshold voltage, a threshold voltage variation of which is out of a reference range. In other words, the memory device 100 may apply a test read voltage to all word lines coupled to one memory block, and output, to the memory controller 200, sensed data indicating the number of memory cells each having an abnormal threshold voltage.

The data manager 230 may obtain, by the counter 220, the number of memory cells each having an abnormal threshold voltage among a plurality of memory cells included in each of a plurality of pages, based on the sensed data received from the memory device 100. Here, if the number of memory cells each having an abnormal threshold voltage is a third reference number or more, the data manager 230 may control the memory device 100 to store the data stored in the memory block in another memory block. Here, the third reference number may be set to a value which is proportional to the number of pages included in the memory block and the threshold value of the ECC.

Figure 8A:
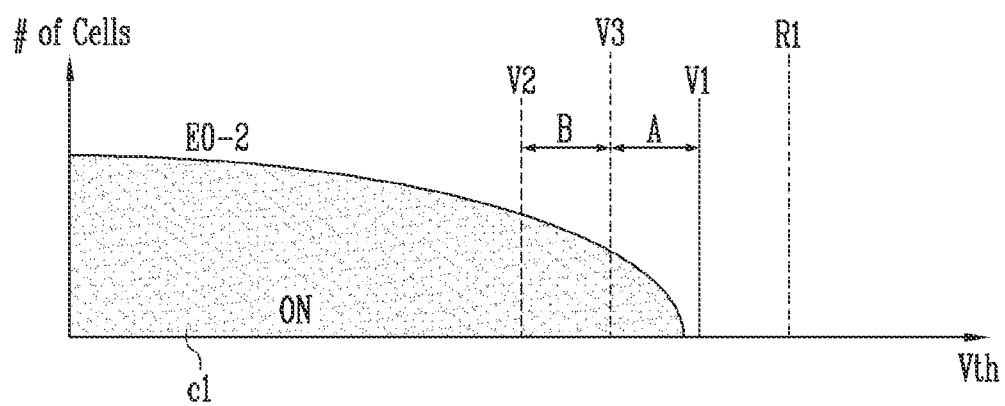
FIGS. 8A to 8C are diagrams for describing a method of counting the number of memory cells in the voltage range in accordance with an embodiment of the present disclosure.
Figure 8B:
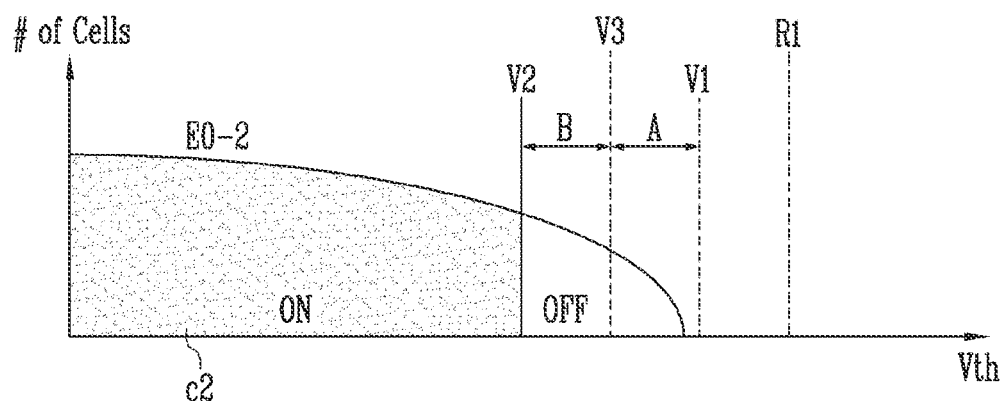
Figure 8C:
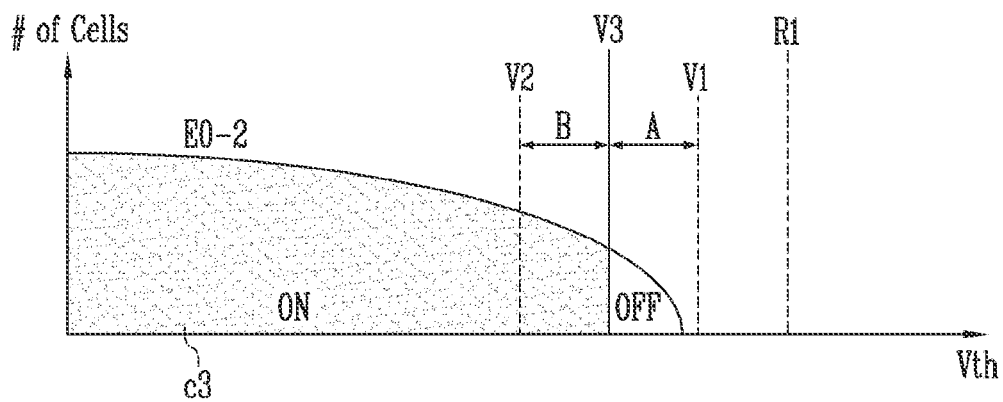

FIGS. 8A to 8C are diagrams for describing a method of counting the number of memory cells in a voltage range in accordance with an embodiment of the present disclosure.

Referring to FIGS. 8A to 8C, at least one voltage range A, B may include a first voltage range A and a second voltage range B.

In this case, the counter 220 may obtain, from among a plurality of memory cells included in any one page, the number a1 of first memory cells having threshold voltages included in the first voltage range A, and the number b1 of second memory cells having threshold voltages included in the second voltage range B.

In an embodiment, the counter 220 may obtain the number a1 of first memory cells by subtracting the number of memory cells each having a threshold voltage lower than the third scan voltage V3 from the number of memory cells each having a threshold voltage lower than the first scan voltage V1.

Referring to FIG. 8A, the memory device 100 may apply the first scan voltage V1 to a word line coupled with a corresponding page. The memory device 100 may apply the first scan voltage V1 to the word line so that memory cells each having a threshold voltage lower than the first scan voltage V1 may be turned on (see FIG. 8A shaded area ON). The memory device 100 may output first sensed data indicating the number c1 of turned-on memory cells to the memory controller 200.

Referring to FIG. 8C, the memory device 100 may apply the third scan voltage V3 to a word line coupled with a corresponding page. The memory device 100 may apply the third scan voltage V3 to the word line so that memory cells each having a threshold voltage lower than the third scan voltage V3 may be turned on (compare FIG. 8C shaded area ON versus non-shaded area OFF). The memory device 100 may output third sensed data indicating the number c3 of turned-on memory cells to the memory controller 200.

In this case, the counter 220 may obtain the number a1 of first memory cells by subtracting the number c3 of turned-on memory cells each having a threshold voltage lower than the third scan voltage V3 from the number c1 of turned-on memory cells each having a threshold voltage lower than the first scan voltage V1, based on the first sensed data and the third sensed data that are output from the memory device 100.

In an embodiment, the counter 220 may obtain the number b1 of second memory cells by subtracting the number of memory cells each having a threshold voltage lower than the second scan voltage V2, from the number of memory cells each having a threshold voltage lower than the third scan voltage V3.

Referring to FIG. 8C, the memory device 100 may apply the third scan voltage V3 to a word line coupled with a corresponding page. The memory device 100 may apply the third scan voltage V3 to the word line so that memory cells each having a threshold voltage lower than the third scan voltage V3 may be turned on. The memory device 100 may output third sensed data indicating the number c3 of turned-on memory cells to the memory controller 200.

Referring to FIG. 8B, the memory device 100 may apply the second scan voltage V2 to a word line coupled with a corresponding page. The memory device 100 may apply the second scan voltage V2 to the word line so that memory cells each having a threshold voltage lower than the second scan voltage V2 may be turned on (compare FIG. 8B shaded area ON versus non-shaded area OFF). The memory device 100 may output second sensed data indicating the number c2 of turned-on memory cells to the memory controller 200.

In this case, the counter 220 may obtain the number b1 of second memory cells by subtracting the number c2 of turned-on memory cells each having a threshold voltage lower than the second scan voltage V2 from the number c3 of turned-on memory cells each having a threshold voltage lower than the third scan voltage V3, based on the third sensed data and the second sensed data that are output from the memory device 100.

Figure 9:
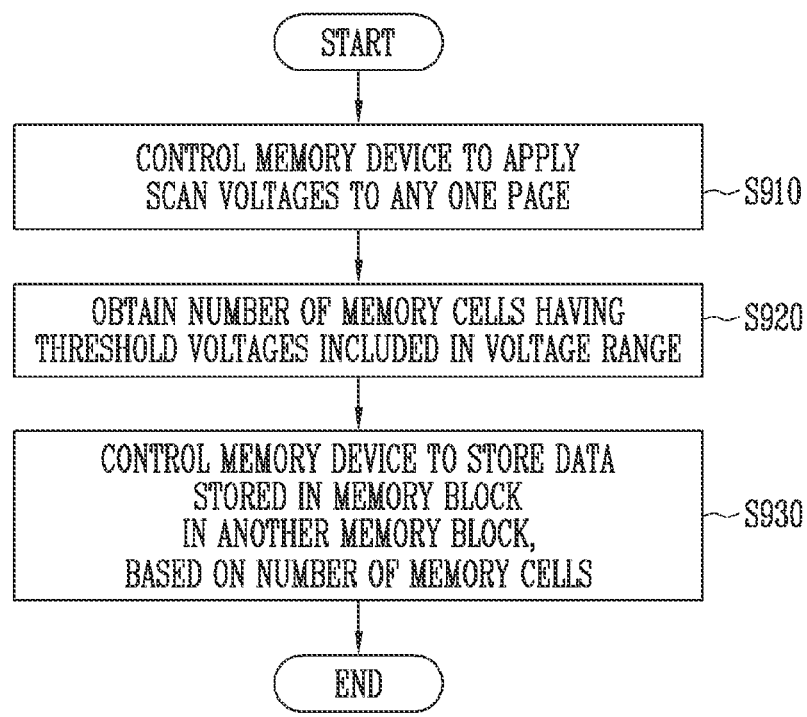
FIG. 9 is a flowchart for describing a method of operating a memory controller in accordance with an embodiment of the present disclosure.

FIG. 9 is a flowchart for describing a method of operating the memory controller 200 in accordance with an embodiment of the present disclosure.

Referring to FIG. 9, the method of operating the memory controller 200 may include operation S910 of controlling the memory device 100 to apply a plurality of scan voltages V1, V2, and V3 to any one page of a plurality of pages, operation S920 of obtaining the number of memory cells each having a threshold voltage included in at least one voltage range A, B defined by the plurality of scan voltages V1, V2, and V3, from among a plurality of memory cells included in any one page, based on sensed data obtained by reading the any one page with the plurality of scan voltages V1, V2, and V3, and operation S930 of controlling the memory device 100 to store data stored in a memory block including the any one page in another memory block, based on the number of memory cells.

In detail, the memory controller 200 may control the memory device 100 to apply a plurality of scan voltages V1, V2, and V3 to any one page of a plurality of pages (at operation S910).

In an embodiment, the at least one voltage range A, B may include a first voltage range A and a second voltage range B.

In an embodiment, a plurality of scan voltages V1, V2, and V3 may include a first scan voltage V1 corresponding to a maximum value of the first voltage range A, a second scan voltage V2 corresponding to a minimum value of the second voltage range B, and a third scan voltage V3 corresponding to a minimum value of the first voltage range A and a maximum value of the second voltage range B. In other words, the first voltage range A and the second voltage range B may be successive ranges, with the third scan voltage V3 as a boundary therebetween. Here, the levels of voltage values may be reduced in a sequence from the first scan voltage V1, the third scan voltage V3, and the second scan voltage V2.

In an embodiment, a plurality of pages each may include a plurality of memory cells. The plurality of memory cells may be programmed to any one programmed state of a plurality of programmed states E0, P1, P2, and P3 so that the plurality of programmed states E0, P1, P2, and P3 separated from each other by threshold voltages each may include a corresponding number of memory cells.

Based on sensed data obtained by reading any one page with the plurality of scan voltages V1, V2, and V3, the number of memory cells each having a threshold voltage included in at least one voltage range A, B defined by the plurality of scan voltages V1, V2, and V3, from among a plurality of memory cells included in the any one page, may be obtained (at operation S920).

In an embodiment, at least one voltage range A or B may be included in a range between a maximum value E0_max of initial threshold voltages of erased cells included in any one page and a voltage value of a smallest default read voltage R1 of at least one preset default read voltage of the memory device 100.

Based on the number of memory cells, the memory device 100 may be controlled to store data stored in a memory block in which the any one page is included, in another memory block (at operation S930).

Thereafter, the memory controller 200 may periodically perform the operation beginning from the foregoing operation S910.

Figure 10:
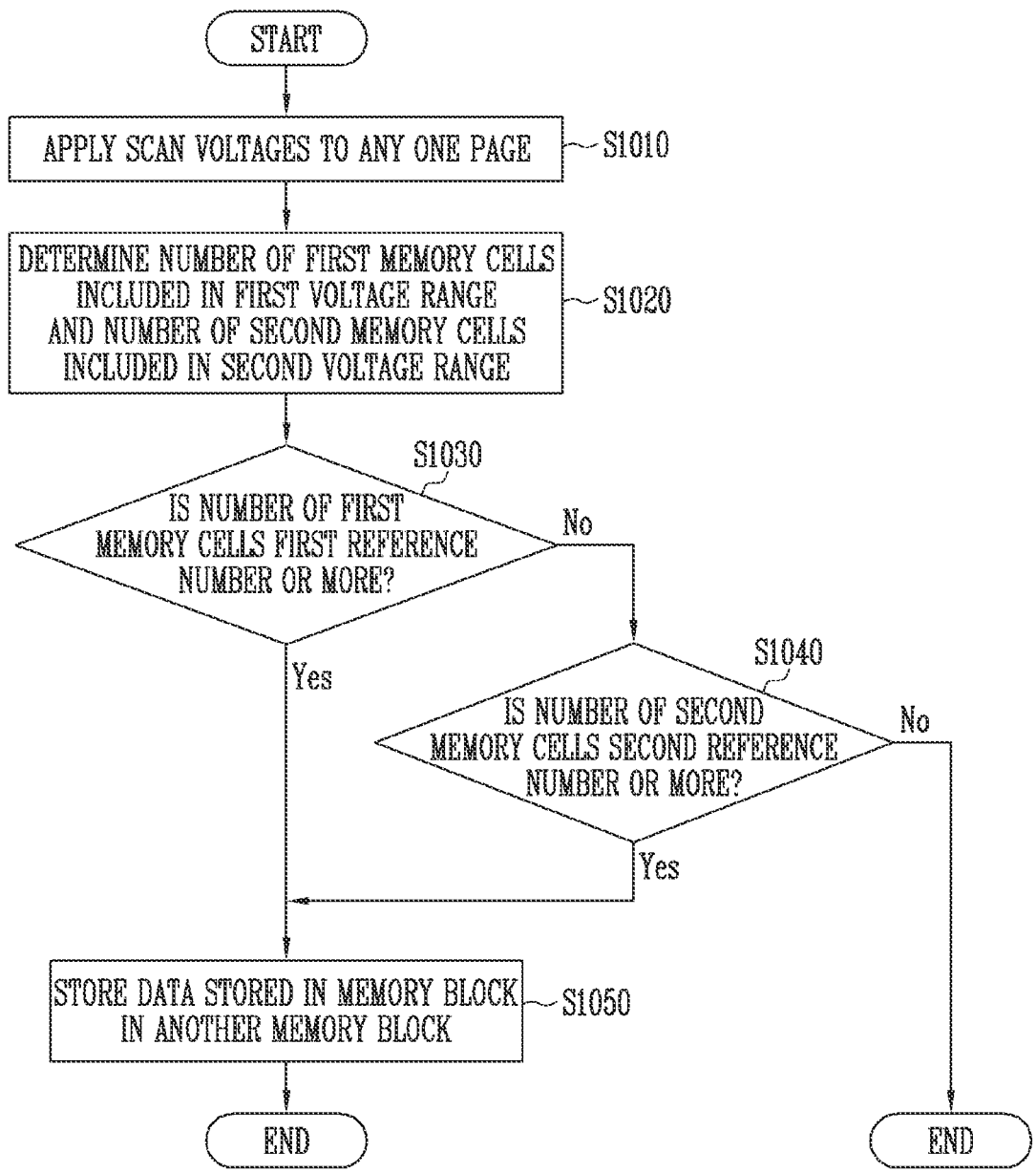
FIG. 10 is a flowchart for describing a method of operating the memory controller in accordance with an embodiment of the present disclosure.

FIG. 10 is a flowchart for describing a method of operating the memory controller 200 in accordance with an embodiment of the present disclosure.

Referring to FIG. 10, the memory controller 200 may control the memory device 100 to apply a plurality of scan voltages V1, V2, and V3 to any one page of a plurality of pages of the memory device 100 (at operation S1010).

The memory controller 200 may obtain, among a plurality of memory cells included in any one page of the memory device 100, the number a1 of first memory cells each having a threshold voltage included in the first voltage range A, and the number b1 of second memory cells each having a threshold voltage included in the second voltage range B (at operation S1020).

In an embodiment, the memory controller 200 may obtain the number a1 of first memory cells by subtracting the number of memory cells each having a threshold voltage lower than the third scan voltage V3 from the number of memory cells each having a threshold voltage lower than the first scan voltage V1. The memory controller 200 may obtain the number b1 of second memory cells by subtracting the number of memory cells each having a threshold voltage lower than the second scan voltage V2 from the number of memory cells each having a threshold voltage lower than the third scan voltage V3.

The memory controller 200 may control the memory device 100 to store data stored in a memory block in another memory block, based on the number a1 of first memory cells and the number b1 of second memory cells. Here, the number a1 of first memory cells may refer to the number of memory cells the threshold voltages of which are included in the first voltage range A. The number b1 of second memory cells may refer to the number of memory cells the threshold voltages of which are included in the second voltage range B.

In detail, the memory controller 200 may determine whether the number a1 of first memory cells is a first reference number or more (at operation S1030). If the number a1 of first memory cells is the first reference number or more ('Yes' at operation S1030), the memory controller 200 may control the memory device 100 to store data stored in a memory block in another memory block (at operation S1050). Here, the first reference number may be a threshold value of an ECC.

If the number a1 of first memory cells is less than the first reference number ('No' at operation S1030), the memory controller 200 may determine whether the number of b1 of second memory cells is a second reference number or more (at operation S1040). Here, the second reference number may be a value greater than the first reference number. For example, the second reference number may have various values, e.g, a value two or three times the first reference number.

Here, if the number a1 of first memory cells is less than the first reference number ('No' at operation S1030) and the number b1 of second memory cells is a second reference number or more ('Yes' at operation S1040), the memory controller 200 may control the memory device 100 to store data stored in the memory block in another memory block (at operation S1050).

If the number a1 of first memory cells is less than the first reference number ('No' at operation S1030) and the number b1 of second memory cells is less than the second reference number ('No' at operation S1040), the memory controller 200 may control the memory device 100 to maintain data stored in a memory block in which any one page is included. In other words, the memory controller 200 may end a scan operation of detecting deterioration of a memory block.

Thereafter, the memory controller 200 may periodically iterate the operation beginning from the foregoing operation S1010.

Figure 11:
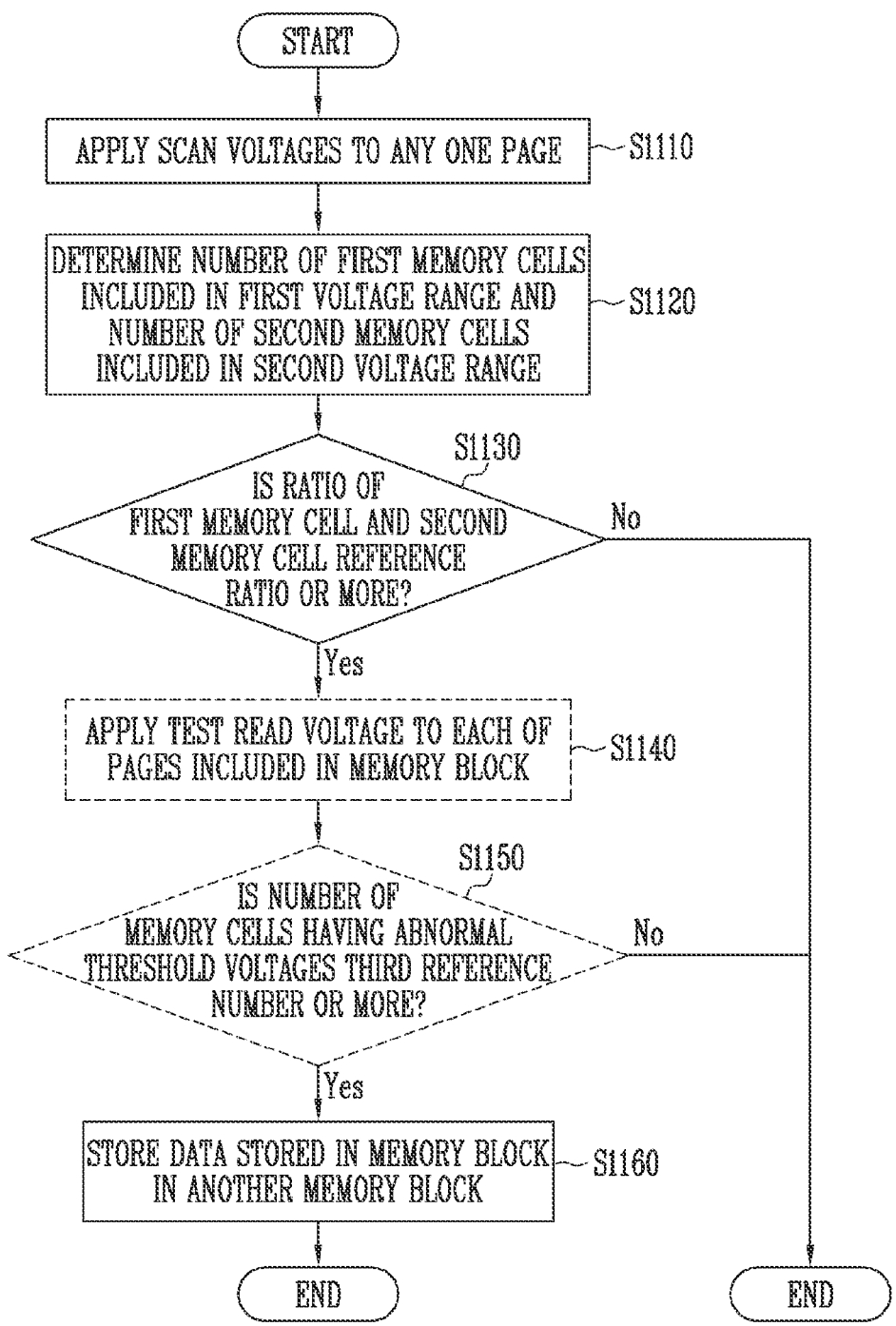
FIG. 11 is a flowchart for describing a method of operating the memory controller in accordance with an embodiment of the present disclosure.

FIG. 11 is a flowchart for describing a method of operating the memory controller 200 in accordance with an embodiment of the present disclosure.

Referring to FIG. 11, the memory controller 200 may control the memory device 100 to apply a plurality of scan voltages V1, V2, and V3 to any one page of a plurality of pages of the memory device 100 (at operation S1110).

The memory controller 200 may obtain, among a plurality of memory cells included in any one page of the memory device 100, the number a1 of first memory cells each having a threshold voltage included in the first voltage range A, and the number b1 of second memory cells each having a threshold voltage included in the second voltage range B (at operation S1120).

In detail, the memory controller 200 may determine whether a ratio of the number a1 of first memory cells and the number b1 of second memory cells is a reference ratio or more (at operation S1130). Here, the ratio of the number a1 of first memory cells and the number b1 of second memory cells may be a value obtained by dividing the number b1 of second memory cells by the number a1 of first memory cells. The reference ratio may have various values such as 2 or 3.

If the ratio of the number a1 of first memory cells and the number b1 of second memory cells is less than the reference ratio ('No' at operation S1130), the memory controller 200 may control the memory device 100 to maintain data stored in a memory block in which any one page is included. In other words, the memory controller 200 may end a scan operation of detecting deterioration of a memory block.

In an embodiment, if the ratio of the number a1 of first memory cells and the number b1 of second memory cells is the reference ratio or more ('Yes' at operation S1130), the memory controller 200 may control the memory device 100 to store the data stored in the memory block in another memory block.

In an embodiment, if the ratio of the number a1 of first memory cells and the number b1 of second memory cells is the reference ratio or more ('Yes' at operation S1130), the memory controller 200 may control the memory device 100 to apply a test read voltage to each of a plurality of pages included in the memory block (operation S1140). The memory controller 200 may obtain the number of memory cells each having an abnormal threshold voltage, from among a plurality of memory cells included in each of the plurality of pages.

The memory controller 200 may determine whether the number of memory cells each having an abnormal threshold voltage is a third reference number or more (at operation S1150). Here, the third reference number may be set to a value which is proportional to the number of pages included in the memory block and the threshold value of the ECC.

Here, if the number of memory cells each having an abnormal threshold voltage is the third reference number or more ('Yes' at operation S1150), the memory controller 200 may control the memory device 100 to store the data stored in the memory block in another memory block (at operation S1160). In contrast, f the number of memory cells each having an abnormal threshold voltage is less than the third reference number ('No' at operation S1150), the memory controller 200 may control the memory device 100 to maintain the data stored in the memory block in which any one page is included. In other words, the memory controller 200 may end a scan operation of detecting deterioration of a memory block. The embodiments described with reference to FIGS. 10 and 11 may be combined with each other.

Figure 12:
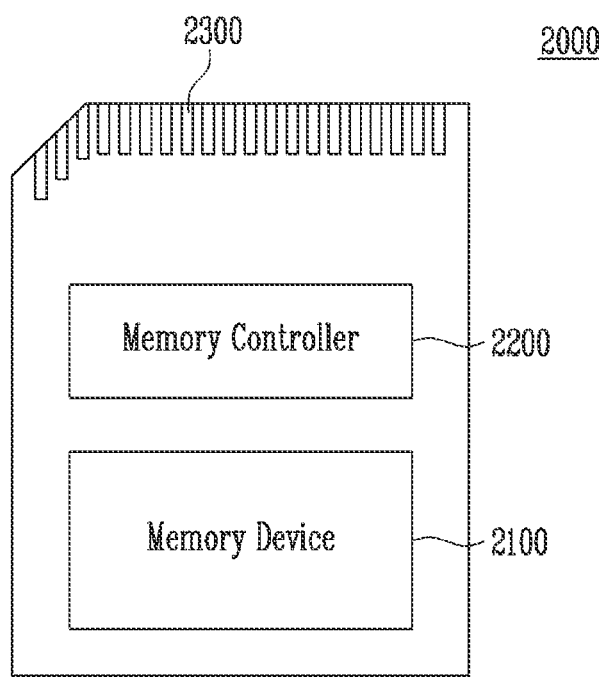
FIG. 12 is a block diagram illustrating a memory card to which the memory system in accordance with an embodiment of the present disclosure is applied.

FIG. 12 is a block diagram illustrating a memory card 2000 to which the memory system in accordance with an embodiment of the present disclosure is applied.

Referring to FIG. 12, the memory card 2000 may include a memory device 2100, a memory controller 2200, and a connector 2300.

The memory device 2100 may perform a program operation of storing data. In an embodiment, the memory device 2100 may be formed of various non-volatile memory devices such as an electrically erasable and programmable ROM (EEPROM), a NAND flash memory, a NOR flash memory, a phase-change RAM (PCRAM), a resistive RAM (ReRAM), a ferroelectric RAM (FeRAM), and a spin transfer torque magnetoresistive RAM (STT-MRAM). The description of the memory device 100 explained with reference to FIG. 1 or the like may be identically applied to the memory device 2100, and hereinafter redundant description will be omitted.

The memory controller 2200 may access the memory device 2100. For example, the memory controller 2200 may control a program operation, a read operation, and an erase operation of the memory device 2100. The memory controller 2200 may provide an interface between the memory device 2100 and the host. The memory controller 2200 may drive firmware for controlling the memory device 2100. The memory controller 2200 may be embodied in the same manner as that of the memory controller 200 described with reference to FIG. 1.

In an embodiment, the memory controller 2200 may include components such as a random access memory (RAM), a processing unit, a host interface, and a memory interface, and an ECC circuit.

The memory controller 2200 may communicate with an external device through the connector 2300. The memory controller 2200 may communicate with an external device (e.g., a host) based on a specific communication protocol. In an embodiment, the memory controller 2200 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

The memory device 2100 and the memory controller 2200 may be integrated into a single semiconductor device to form a memory card. For example, the memory device 2100 and the memory controller 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 13:
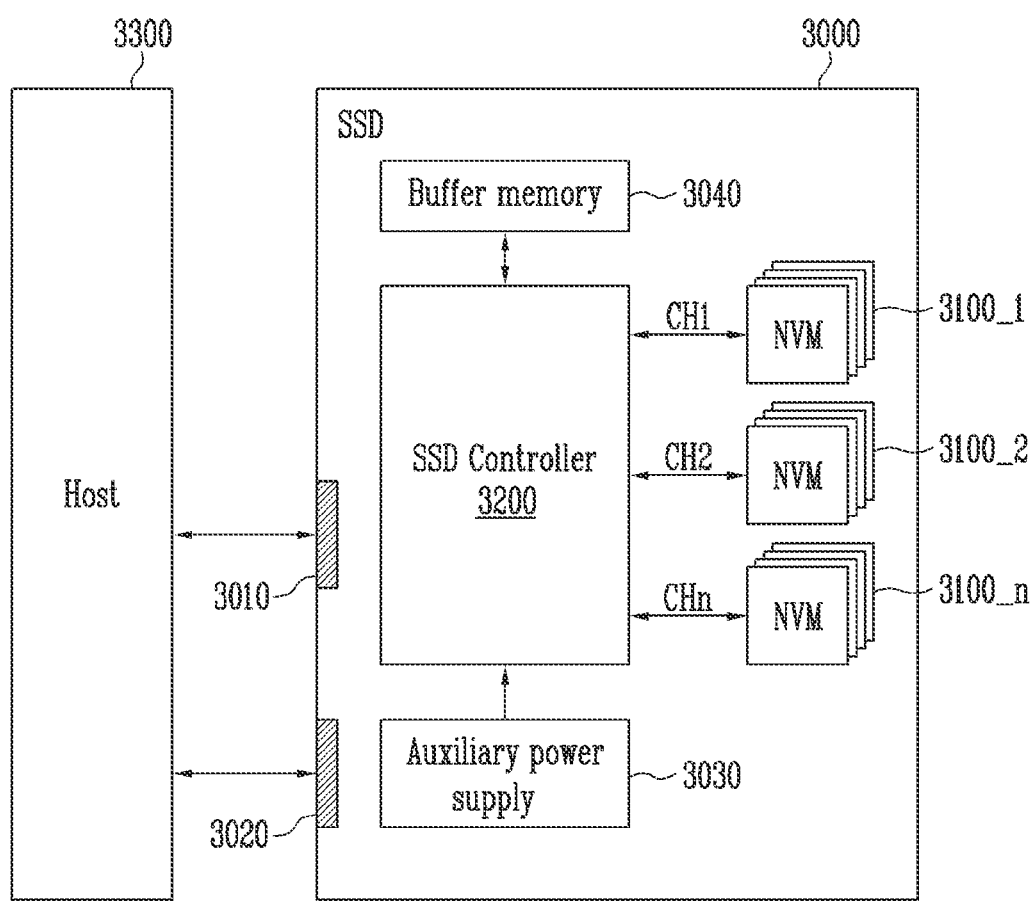
FIG. 13 is a block diagram illustrating a solid state drive (SSD) system to which the memory system in accordance with an embodiment of the present disclosure is applied.

FIG. 13 is a block diagram illustrating a solid state drive (SSD) system 3000 to which the memory system in accordance with an embodiment of the present disclosure is applied.

Referring to FIG. 13, the SSD system 3000 may include a plurality of flash memories 3100_1 to 3100_n, channels CH1 to CHn, an SSD controller 3200, an auxiliary power supply 3030, and a buffer memory 3040.

The SSD system 3000 may transmit/receive a signal to/from a host 3300 through a signal connector 3010, and receive power through the power connector 3020.

Each of the plurality of flash memories 3100_1 to 3100_n may perform a program operation of storing data. In an embodiment, each of the plurality of flash memories 3100_1 to 3100_n may be formed of various non-volatile memory devices such as an electrically erasable and programmable ROM (EEPROM), a NAND flash memory, a NOR flash memory, a phase-change RAM (PCRAM), a resistive RAM (ReRAM), a ferroelectric RAM (FeRAM), and a spin transfer torque magnetoresistive RAM (STT-MRAM). The description of the memory device 100 explained with reference to FIG. 1 or the like may be identically applied to each of the plurality of flash memories 3100_1 to 3100_n, and hereinafter redundant description will be omitted.

The SSD controller 3200 may control the plurality of flash memories 3100_1 to 3100_n in response to a signal received from the host 3300. For example, the signal may include signals based on an interface between the host 3300 and the SSD system 3000. For example, the signal may be signals defined by at least one of various interfaces such as universal serial bus (USB), a multimedia card (MMC), an embedded MMC (eMMC), peripheral component interconnection (PCI), PCI-express (PCI-E), advanced technology attachment (ATA), serial-ATA (SATA), parallel-ATA (PATA), a small computer system interface (SCSI), an enhanced small disk interface (ESDI), integrated drive electronics (IDE), firewire, universal flash storage (UFS), Wi-Fi, Bluetooth, and nonvolatile memory express (NVMe) interfaces. In an embodiment, the SSD controller 3200 may perform the function of the memory controller 200, described above with reference to FIG. 1.

The auxiliary power supply 3030 may be coupled with the host 3300 through the power connector 3020. The auxiliary power supply 3030 may be supplied with power from the host 3300, and may be charged by the power. The auxiliary power supply 3030 may supply the power of the SSD system 3000 when the supply of power from the host 3300 is not smoothly performed. For example, the auxiliary power supply 3030 may be positioned inside the SSD system 3000 or positioned outside the SSD system 3000. For instance, the auxiliary power supply 3030 may be disposed in a main board and may supply auxiliary power to the SSD system 3000.

The buffer memory 3040 may be operated as a buffer memory of the SSD 3000. For example, the buffer memory 3040 may temporarily store data received from the host 3300 or data received from the plurality of flash memories 3100_1 to 3100_n, or may temporarily store metadata (e.g., a mapping table) of the flash memories 3100_1 to 3100_n. The buffer memory 3040 may include volatile memories such as a DRAM, an SDRAM, a DDR SDRAM, an LPDDR SDRAM, and a GRAM or nonvolatile memories such as an FeRAM, a ReRAM, an STT-MRAM, and a PCRAM.

Figure 14:
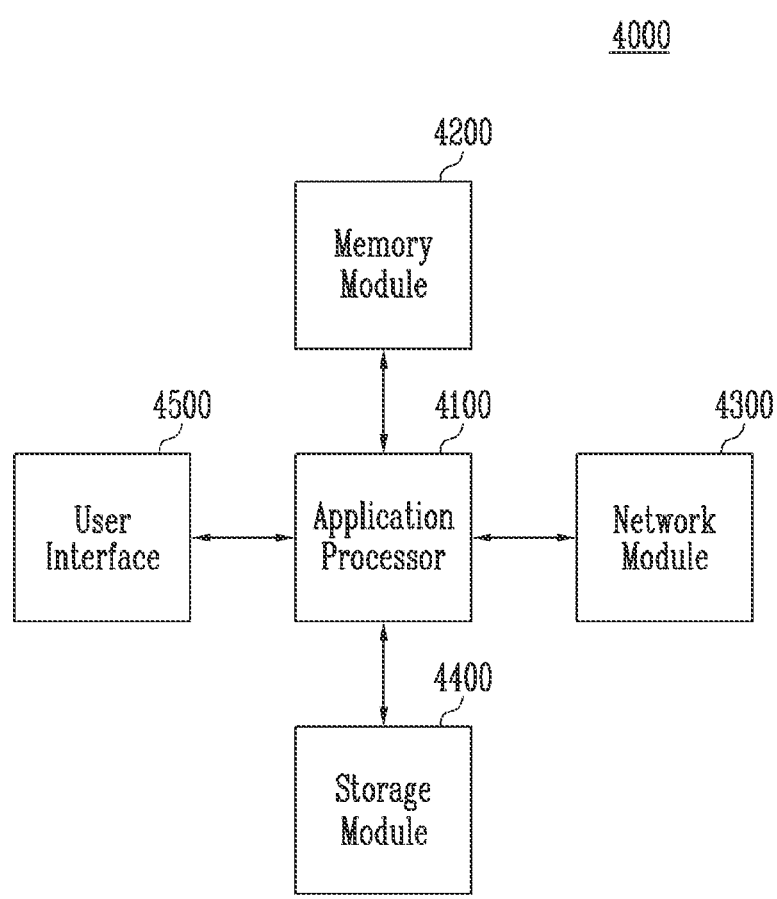
FIG. 14 is a block diagram illustrating a user system to which the memory system in accordance with an embodiment of the present disclosure is applied.

FIG. 14 is a block diagram illustrating a user system 4000 to which the memory system in accordance with an embodiment of the present disclosure is applied.

Referring to FIG. 14, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc., for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PCRAM, a ReRAM, an MRAM, and an FeRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PCRAM), a magnetoresistive RAM (MRAM), a resistive RAM (ReRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the memory system 1000 described above with reference to FIG. 1.

The user interface 4500 may include interfaces for inputting data or instructions to the application processor 4100, or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, a monitor, and so on.

Various embodiments of the present disclosure may provide a memory system capable of rapidly and accurately determining a deterioration state of a memory block to maintain reliability of data, and a method of operating the memory system.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller configured to control a memory device including a plurality of memory blocks each including a plurality of pages, the memory controller comprising:
a scan voltage controller configured to control the memory device to apply a plurality of scan voltages to any one page of the plurality of pages;
a counter configured to obtain, based on sensed data obtained by reading the any one page with the plurality of scan voltages, a number of memory cells having a threshold voltage included in at least one voltage range defined by the plurality of scan voltages, from among a plurality of memory cells included in the any one page; and
a data manager configured to control the memory device to store data stored in a memory block including the any one page, in another memory block, based on the number of memory cells.

2. The memory controller according to claim 1, wherein the at least one voltage range is included in a range between a maximum value of initial threshold voltages of erased cells included in the any one page, and a smallest default read voltage value of at least one default read voltage of the memory device.

3. The memory controller according to claim 1,
wherein the at least one voltage range includes a first voltage range and a second voltage range,
wherein the counter is configured to obtain a number of first memory cells having a threshold voltage included in the first voltage range, and a number of second memory cells having a threshold voltage included in the second voltage range, from among the plurality of memory cells included in the any one page, and
wherein the data manager is configured to control the memory device to store the data stored in the memory block in the another memory block, based on the number of first memory cells and the number of second memory cells.

4. The memory controller according to claim 3, wherein the plurality of scan voltages include a first scan voltage corresponding to a maximum value of the first voltage range, a second scan voltage corresponding to a minimum value of the second voltage range, and a third scan voltage corresponding to a minimum value of the first voltage range and a maximum value of the second voltage range.

5. The memory controller according to claim 4, wherein the data manager is configured to control the memory device to store the data stored in the memory block in the another memory block, when the number of first memory cells is a first reference number or more.

6. The memory controller according to claim 5,
wherein the data manager is configured to control the memory device to store the data stored in the memory block in the another memory block, when the number of first memory cells is less than the first reference number and the number of second memory cells is a second reference number or more, and
wherein the second reference number is greater than the first reference number.

7. The memory controller according to claim 4, wherein the data manager is configured to control the memory device to store the data stored in the memory block in the another memory block, when a ratio of the number of first memory cells and the number of second memory cells is a reference ratio or more.

8. The memory controller according to claim 4,
wherein the data manager is configured to control the scan voltage controller to apply a test read voltage to each of the plurality of pages included in the memory block, when a ratio of the number of first memory cells and the number of second memory cells is a reference ratio or more, wherein the data manager is configured to obtain, through the counter, a number of memory cells having an abnormal threshold voltage, from among a plurality of memory cells included in each of the plurality of pages, and wherein the data manager is configured to control the memory device to store the data stored in the memory block in the another memory block, when the number of memory cells having the abnormal threshold voltage is a third reference number or more.

9. The memory controller according to claim 3, wherein the counter is configured to obtain the number of first memory cells by subtracting a number of memory cells having a threshold voltage lower than the third scan voltage from a number of memory cells having a threshold voltage lower than the first scan voltage, and wherein the counter is configured to obtain the number of second memory cells by subtracting a number of memory cells having a threshold voltage lower than the second scan voltage from the number of memory cells having a threshold voltage lower than the third scan voltage.

10. The memory controller according to claim 1, wherein the plurality of memory cells are programmed to any one programmed state of a plurality of programmed states which are separated from each other by a threshold voltage, so that the plurality of programmed states each include a corresponding number of memory cells.

11. A method of operating a memory controller configured to control a memory device including a plurality of memory blocks each including a plurality of pages, the method comprising:

controlling the memory device to apply a plurality of scan voltages to any one page of the plurality of pages;

obtaining, based on sensed data obtained by reading the any one page with the plurality of scan voltages, a number of memory cells having a threshold voltage included in at least one voltage range defined by the plurality of scan voltages, from among a plurality of memory cells included in the any one page; and controlling the memory device to store data stored in a memory block including the any one page in another memory block, based on the number of memory cells.

12. The method according to claim 11, wherein the at least one voltage range is included in a range between a maximum value of initial threshold voltages of erased cells included in the any one page, and a smallest default read voltage value of at least one default read voltage of the memory device.

13. The method according to claim 11, wherein the at least one voltage range includes a first voltage range and a second voltage range, wherein obtaining the number of memory cells comprises obtaining a number of first memory cells having a threshold voltage included in the first voltage range, and a number of second memory cells having a threshold voltage included in the second voltage range, from among the plurality of memory cells included in the any one page, and wherein controlling the memory device to store the data comprises controlling the memory device to store the data stored in the memory block in the another memory block, based on the number of first memory cells and the number of second memory cells.

14. The method according to claim 13, wherein the plurality of scan voltages include a first scan voltage corresponding to a maximum value of the first voltage range, a second scan voltage corresponding to a minimum value of the second voltage range, and a third scan voltage corresponding to a minimum value of the first voltage range and a maximum value of the second voltage range.

15. The method according to claim 14, wherein controlling the memory device to store the data comprises controlling the memory device to store the data stored in the memory block in the another memory block, when the number of first memory cells is a first reference number or more.

16. The method according to claim 15, wherein controlling the memory device to store the data comprises controlling the memory device to store the data stored in the memory block in the another memory block, when the number of first memory cells is less than the first reference number and the number of second memory cells is a second reference number or more, and wherein the second reference number is greater than the first reference number.

17. The method according to claim 14, wherein controlling the memory device to store the data comprises controlling the memory device to store the data stored in the memory block in the another memory block when a ratio of the number of first memory cells and the number of second memory cells is a reference ratio or more.

18. The method according to claim 14, wherein controlling the memory device to store the data comprises:

controlling the memory device to apply a test read voltage to each of the plurality of pages included in the memory block, when a ratio of the number of first memory cells and the number of second memory cells is a reference ratio or more;

obtaining a number of memory cells having an abnormal threshold voltage, from among a plurality of memory cells included in each of the plurality of pages; and controlling the memory device to store the data stored in the memory block in the another memory block, when the number of memory cells having the abnormal threshold voltage is a third reference number or more.

19. The method according to claim 14, wherein obtaining the number of memory cells comprises:

obtaining the number of first memory cells by subtracting a number of memory cells having a threshold voltage lower than the third scan voltage from a number of memory cells having a threshold voltage lower than the first scan voltage; and obtaining the number of second memory cells by subtracting a number of memory cells having a threshold voltage lower than the second scan voltage from the number of memory cells having a threshold voltage lower than the third scan voltage.

20. The method according to claim 11, wherein the plurality of memory cells are programmed to any one programmed state of a plurality of programmed states which are separated from each other by a threshold voltage, so that the plurality of programmed states each include a corresponding number of memory cells.

* * * * *